(12) United States Patent
Chen et al.

(10) Patent No.: US 9,839,149 B2
(45) Date of Patent: Dec. 5, 2017

(54) FIXING BRACKET

(71) Applicant: Quanta Computer, Inc., Taoyuan Shien (TW)

(72) Inventors: Chao-Jung Chen, New Taipei (TW); Yaw-Tzorng Tsorng, Taipei (TW); Mao-Chao Yang, Guanyin Township, Taoyuan County (TW); Kuan-Ru Chen, New Taipei (TW)

(73) Assignee: QUANTA COMPUTER INC., Taoyuan (TW)

( * ) Notice: Subject to any disclaimer, the term of this patent is extended or adjusted under 35 U.S.C. 154(b) by 22 days.

(21) Appl. No.: 14/058,116

(22) Filed: Oct. 18, 2013

(65) Prior Publication Data

US 2015/0014500 A1    Jan. 15, 2015

(30) Foreign Application Priority Data

Jul. 11, 2013  (TW) .............................. 102124958 A

(51) Int. Cl.
*H05K 5/02*   (2006.01)
*G11B 33/12*  (2006.01)

(52) U.S. Cl.
CPC ......... *H05K 5/0217* (2013.01); *G11B 33/124* (2013.01); *G11B 33/128* (2013.01)

(58) Field of Classification Search
CPC ..... G06F 1/187; G11B 33/124; G11B 33/128; G11B 15/67581; G11B 17/046; H05K 5/0217
USPC ..... 248/202.1, 213.1, 213.2, 222.51, 222.52, 248/229.16, 220.21, 224.8, 225.21, 200, 248/300, 225.11; 361/679.01, 679.02, 361/679.32–679.39, 724–727, 361/679.55–679.58, 685, 683, 747
See application file for complete search history.

(56) References Cited

U.S. PATENT DOCUMENTS

| | | | | |
|---|---|---|---|---|
| 5,557,499 | A  * | 9/1996 | Reiter ..................... | G06F 1/184 312/223.2 |
| 6,728,109 | B1 * | 4/2004 | Wu ......................... | G06F 1/181 361/679.36 |
| 7,016,190 | B1 * | 3/2006 | Chang ..................... | G06F 1/184 235/381 |
| 7,036,783 | B2 * | 5/2006 | Chen ....................... | G11B 33/128 248/222.11 |

(Continued)

*Primary Examiner* — Muhammad Ijaz
(74) *Attorney, Agent, or Firm* — Nixon Peabody LLP; Eduardo J. Quinones

(57) ABSTRACT

A fixing bracket is used to fix a plurality of storage devices in a housing. Each of the storage devices has a first sidewall and a second sidewall opposite and respectively having plurality of fixing holes. The fixing bracket includes a frame body and two pivotal members. The frame body has an opening and an accommodating space. The frame body includes a plurality of first fixing pins in the accommodating space. The storage devices can be accommodated in the accommodating space. Each of the first fixing pins is for being inserted into the corresponding fixing hole on the first sidewall. The pivotal members are pivotally connected to the frame body. Each of the pivotal members includes a plurality of second fixing pins. When the pivotal members cover parts of the opening, each of the second fixing pins is for being inserted into the corresponding fixing hole on the second sidewall.

7 Claims, 6 Drawing Sheets

(56) References Cited

U.S. PATENT DOCUMENTS

| | | | | |
|---|---|---|---|---|
| 7,443,667 B2* | 10/2008 | Guo | ……………… | G06F 1/187 |
| | | | | 312/223.2 |
| 7,511,952 B2* | 3/2009 | Chen | ……………… | G11B 33/12 |
| | | | | 361/679.33 |
| 8,749,966 B1* | 6/2014 | Boudreau | …………… | G06F 1/187 |
| | | | | 361/679.33 |
| 2004/0001308 A1* | 1/2004 | Yang | ……………… | G06F 1/181 |
| | | | | 361/679.33 |
| 2005/0063151 A1* | 3/2005 | Dean | ……………… | G06F 1/187 |
| | | | | 361/679.33 |
| 2008/0253078 A1* | 10/2008 | Neukam | ……………… | G06F 1/183 |
| | | | | 361/679.31 |
| 2009/0059508 A1* | 3/2009 | Peng | ……………… | G11B 33/128 |
| | | | | 361/679.33 |
| 2009/0154006 A1* | 6/2009 | Chen | ……………… | G11B 33/124 |
| | | | | 360/99.13 |
| 2009/0168326 A1* | 7/2009 | Chen | ……………… | G06F 1/187 |
| | | | | 361/679.39 |
| 2011/0051366 A1* | 3/2011 | Chen | ……………… | G06F 1/187 |
| | | | | 361/679.58 |
| 2011/0090639 A1* | 4/2011 | Li | ……………… | G11B 33/124 |
| | | | | 361/679.39 |
| 2012/0268889 A1* | 10/2012 | Ganta | ……………… | G11B 33/128 |
| | | | | 361/679.33 |

* cited by examiner

FIXING BRACKET

CROSS-REFERENCE TO RELATED APPLICATIONS

This application claims priority to Taiwan Application Serial Number 102124958, filed Jul. 11, 2013, which is herein incorporated by reference.

FIELD OF THE INVENTION

The present disclosure relates to a fixing bracket, and more particularly, to a fixing bracket for fixing a storage device in a housing of a server.

BACKGROUND

At present, there exist many approaches to fix a storage device (e.g., a hard disk drive or a CD-ROM drive) in the computer industry. The most widely used approach is to fix the storage device to the housing of a computer by using screws.

With the progress of computers, brackets that are conveniently assembled or disassembled are developed. One of the brackets for carrying the storage device is to fix the storage device with the screws. The bracket to which the storage device is fixed is first placed into the housing guided by guiding members in the housing, and the bracket is secured to the housing by the screws for fixing the storage device in the housing. As being repaired or replaced, the storage device can be taken out only by disassembling all the screws fixing the bracket to the housing and the storage device to the bracket. That is, the fixing screws required for disassembling exist for the fixations of the storage device to the bracket and the bracket to the housing.

However, the forgoing approach cannot decrease the assembly costs of the housing of the computer because it not only is unable to improve the speed of assembling the storage device, but also is consuming a lot of labor hour. Furthermore, there are various types of the screws (e.g., slotted screws, Phillips screws, torx screws, etc.), so that maintenance staffs must prepare many types of screwdrivers to assemble and disassemble the screws, which is very time-consuming and inconvenient. The problem has huge impact to cloud products having a large number of storage devices to be installed.

Accordingly, how to provide a fixing design that can be rapidly assembled and disassembled and can fix storage devices without using screws becomes an important issue.

SUMMARY

The disclosure provides a fixing bracket for fixing a plurality of storage devices in a housing. Each of the storage devices has a first sidewall and a second sidewall. The first sidewall and the second sidewall are opposite to each other and respectively have plurality of fixing holes. The fixing bracket includes a frame body and two pivotal members. The frame body has an opening and an accommodating space. The frame body includes a plurality of first fixing pins in the accommodating space. The accommodating space is configured to accommodate the storage devices from the opening. Each of the first fixing pins is for being inserted into the corresponding fixing hole on the first sidewall. The pivotal members are pivotally connected to the frame body to rotate to open or cover parts of the opening. Each of the pivotal members includes a plurality of second fixing pins. When the pivotal members cover the parts of the opening, each of the second fixing pins is for being inserted into the corresponding fixing hole on the second sidewall.

In an embodiment of the disclosure, the frame body includes a top board, a bottom board, and a backboard. The bottom board is parallel to the top board. Each of the pivotal members is pivotally connected to the top board and the bottom board. The backboard is connected between the top board and the bottom board and opposite to the opening. The first fixing pins are disposed on the backboard.

In an embodiment of the disclosure, the top board includes two first engaging structures respectively adjacent to the pivotal members. Each of the pivotal members includes a first pivotal plate and a covering plate. The first pivotal plate is pivotally connected to the top board and has a first engaging portion. The covering plate is connected to the first pivotal plate. The second fixing pins are disposed on the covering plate. When the covering plate rotates together with the first pivotal plate to cover the parts of the opening, the covering plate abuts against the top board and the bottom board, and the first engaging portion is engaged with the corresponding first engaging structure.

In an embodiment of the disclosure, the top board further includes a first plate body. The first engaging portion is a first hole. Each of the first engaging structures includes a first elastic piece and a first protrusion. The first elastic piece is connected to an edge of the first plate body. The first protrusion is disposed at a surface of the first elastic piece facing away from the accommodating space. During the period that the corresponding pivotal member covers toward the opening, the corresponding first pivotal plate pushes the first protrusion, so as to make the first elastic piece move toward the accommodating space. When the corresponding covering plate abuts against the top board and the bottom board, the first elastic piece recovers to make the first protrusion be engaged with the corresponding first hole.

In an embodiment of the disclosure, the bottom board includes two second engaging structures respectively adjacent to the pivotal members. Each of the pivotal members comprises a second pivotal plate and a covering plate. The second pivotal plate is pivotally connected to the bottom board and has a second engaging portion. The covering plate is connected to the second pivotal plate. The second fixing pins are disposed on the covering plate. When the covering plate rotates together with the second pivotal plate to cover the parts of the opening, the covering plate abuts against the top board and the bottom board, and the second engaging portion is engaged with the corresponding second engaging structure.

In an embodiment of the disclosure, the bottom board further includes a second plate body. The second engaging portion is a second hole. Each of the second engaging structures includes a second elastic piece and a second protrusion. The second elastic piece is connected to an edge of the second plate body. The second protrusion is disposed at a surface of the second elastic piece facing away from the accommodating space. During the period that the corresponding pivotal member covers toward the opening, the corresponding second pivotal plate pushes the second protrusion, so as to make the second elastic piece move toward the accommodating space. When the corresponding covering plate abuts against the top board and the bottom board, the second elastic piece recovers to make the second protrusion be engaged with the corresponding second hole.

In an embodiment of the disclosure, the bottom board further includes a third engaging structure. The third engaging structure is located at a surface of the bottom board facing away from the accommodating space to be engaged with a chute on the housing.

Accordingly, the fixing bracket of the disclosure is capable of accommodating a plurality of storage devices. After the storage devices are accommodated in the fixing bracket and the pivotal members cover the parts of the opening of the frame body, the first fixing pins disposed on the frame body and the second fixing pins disposed on the pivotal members respectively insert into the fixing holes at two opposite sidewalls of the storage devices, so as to achieve the purpose of fixing the storage devices in the fixing bracket. Furthermore, when the pivotal members cover the parts of the opening, the engaging portions on the pivotal members are engaged with the engaging structures on the frame body, so as to prevent the problem that the pivotal members unexpectedly open the opening and thus let the storage devices to leave the frame body. Moreover, the fixing bracket of the disclosure further has an additional engaging structure disposed at the bottom of the frame body to be engaged with the chute of the housing, so as to achieve the purpose of rapidly fixing the storage devices in the housing without using screws.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
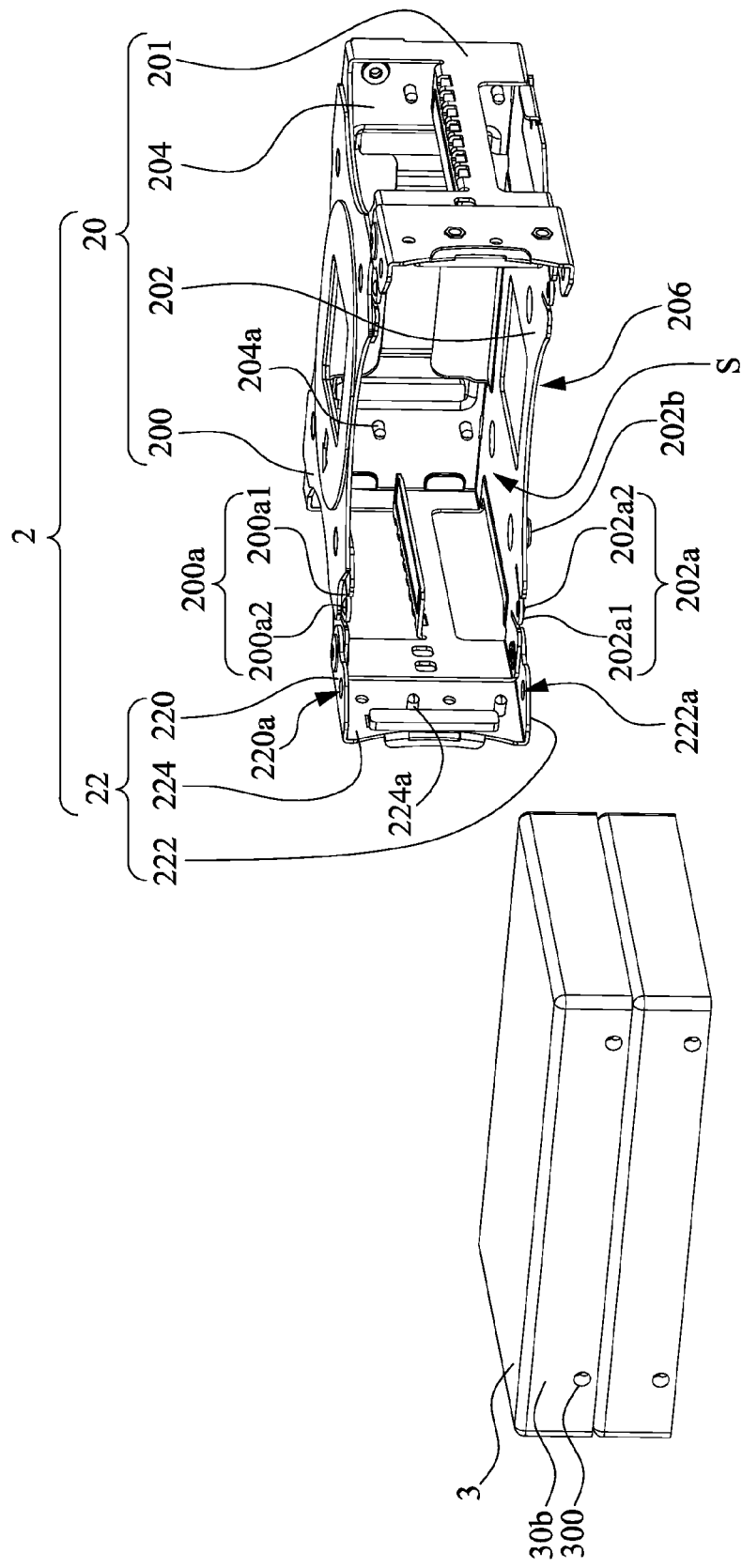
FIG. 1A is an exploded view of a fixing bracket and storage devices according to an embodiment of the disclosure.

Reference will now be made in detail to the present embodiments of the disclosure, examples of which are illustrated in the accompanying drawings. Wherever possible, the same reference numbers are used in the drawings and the description to refer to the same or like parts.

Figure 1B:
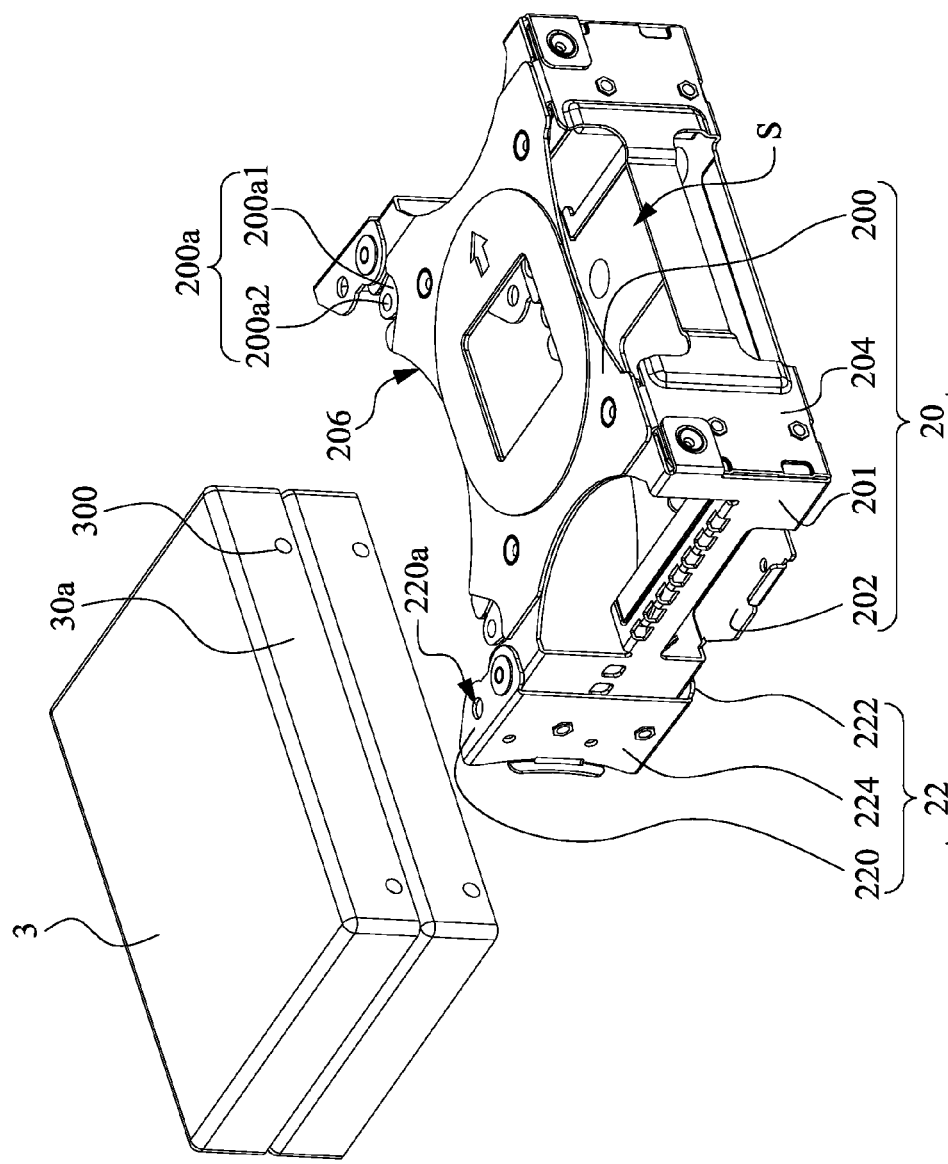
FIG. 1B is another exploded view of FIG. 1A.

FIG. 1A is an exploded view of a fixing bracket 2 and storage devices 3 according to an embodiment of the disclosure. FIG. 1B is another exploded view of FIG. 1A.

As shown in FIG. 1A and FIG. 1B, the fixing bracket 2 is used to accommodate two storage devices 3. Each of the storage devices 3 has a first sidewall 30a and a second sidewall 30b that are opposite to each other. The first sidewall 30a and the second sidewall 30b of each of the storage devices 3 respectively have plurality of fixing holes 300. The fixing bracket 2 includes a frame body 20 and two pivotal members 22. The frame body 20 of the fixing bracket 2 has an opening 206 and an accommodating space S. The frame body 20 includes a plurality of first fixing pins 204a in the accommodating space S.

In detail, the frame body 20 of the fixing bracket 2 includes a top board 200, a bottom board 202, a plurality of connecting ribs 201, and a backboard 204. The bottom board 202 of the frame body 20 is connected to the top board 200 by the connecting ribs 201, so that the bottom board 202 is parallel to the top board 200. Each of the pivotal members 22 is pivotally connected to the top board 200 and the bottom board 202 and is adjacent to the opening 206. The backboard 204 of the frame body 20 is connected between the top board 200 and the bottom board 202 and is opposite to the opening 206 (i.e., the backboard 204 is located away from the opening 206 and the pivotal members 22). The first fixing pins 204a of the frame body 20 are disposed on the backboard 204.

Figure 2:
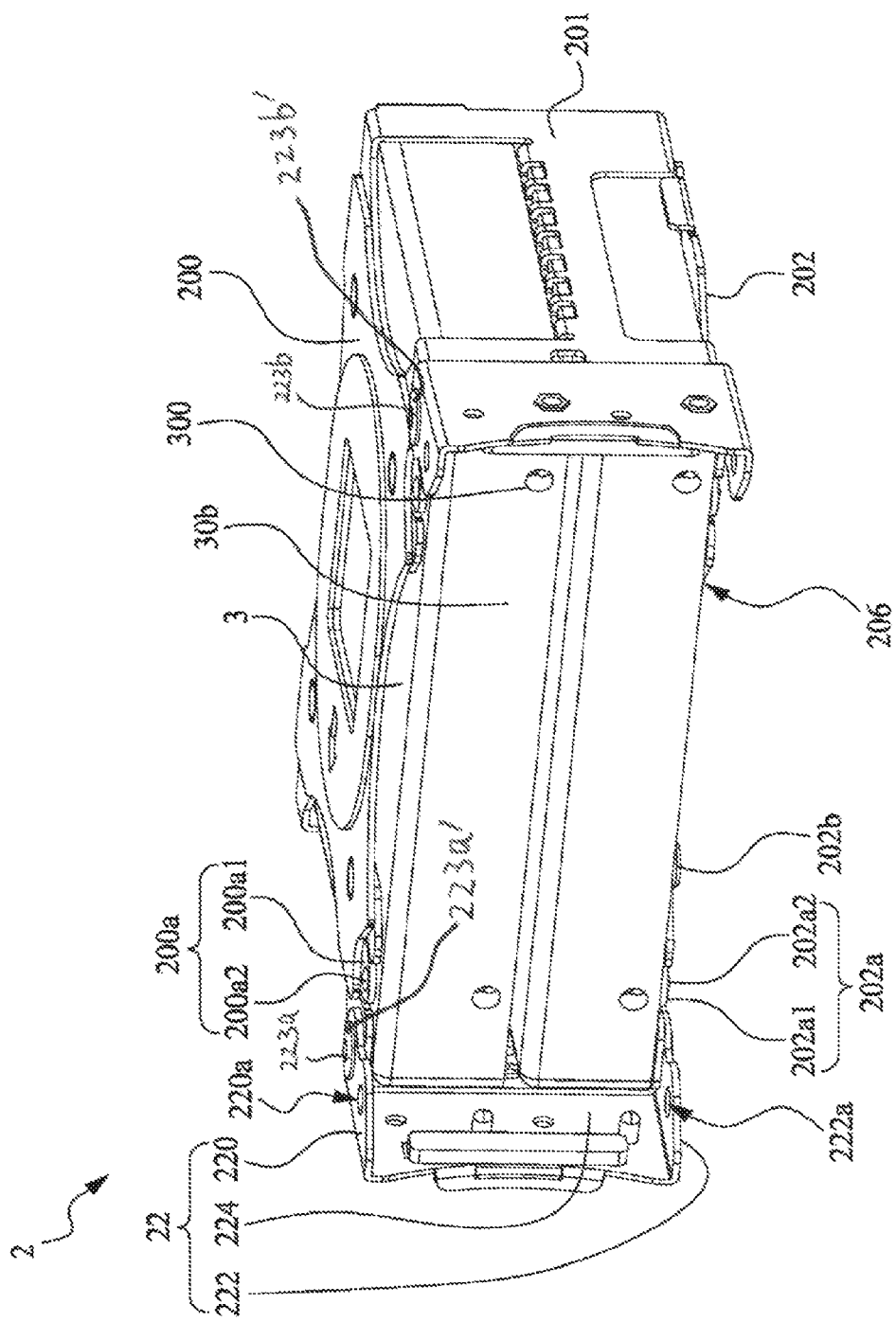
FIG. 2 is a perspective view of the fixing bracket and the storage devices in FIG. 1A, in which pivotal members open the opening.
Figure 3:
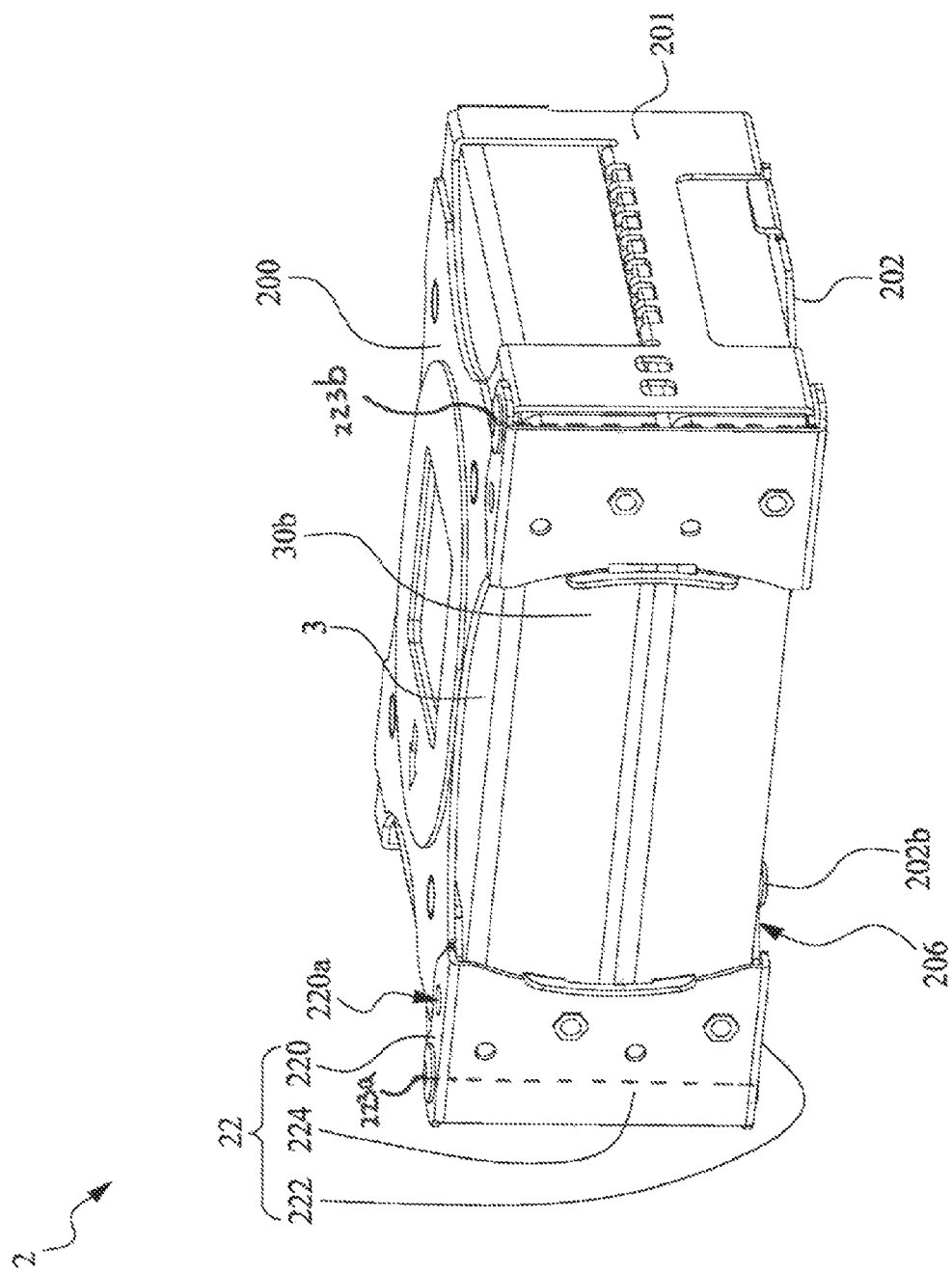
FIG. 3 is another perspective view of FIG. 2, in which the pivotal members close parts of the opening.

FIG. 2 is a perspective view of the fixing bracket 2 and the storage devices 3 in FIG. 1A, in which pivotal members 22 open the opening 206. FIG. 3 is another perspective view of FIG. 2, in which the pivotal members 22 close parts of the opening 206.

As shown in FIG. 2 and FIG. 3, the storage devices 3 can be accommodated in the accommodating space S from the opening 206 of the frame body 20. Each of the first fixing pins 204a on the backboard 204 is inserted into the corresponding fixing hole 300 on the first sidewall 30a. The pivotal members 20 of the fixing bracket 2 are pivotally connected to the frame body 20, so as to rotate to open or cover parts of the opening 206 of the frame body 20. Each of the pivotal members 22 of the fixing bracket 2 includes a plurality of second fixing pins 224a. When the pivotal members 22 of the fixing bracket 2 cover the parts of the opening 206 of the frame body 20, each of the second fixing pins 224a on the pivotal members 22 is inserted into the corresponding fixing hole 300 on the second sidewall 30b. In other words, after the storage devices 3 are accommodated in the frame body 20 of the fixing bracket 2 and the pivotal members 22 cover the parts of the opening 206 of the frame body 20, the first fixing pins 204a disposed in the frame body 20 (particularly, disposed on the backboard 204) and the second fixing pins 224a disposed on the pivotal members 22 are respectively inserted into the fixing holes 300 on the first sidewalls 30a and the fixing holes 300 on the second sidewalls of the storage devices 3, so as to achieve the purpose of fixing the storage devices 3 in the fixing bracket 2.

It should be pointed out that the number of the storage devices 3 that are accommodated in the fixing bracket 2 of the disclosure is not limited in this regard and can be adjusted as needed, and the number of the first fixing pins 204a disposed in the frame body 20 and the number of the second fixing pins 224a disposed on the pivotal members 22 needs to be adjusted correspondingly.

In detail, the top board 200 of the frame body 20 includes two first engaging structures 200a. The first engaging structures 200a of the top board 200 are respectively adjacent to the pivotal members 22. The bottom board 202 of the frame body 20 includes two second engaging structures 202a. The second engaging structures 202a of the bottom board 202 are respectively adjacent to the pivotal members 22. Each of the pivotal members 22 of the fixing bracket 2 includes a first pivotal plate 220, a second pivotal plate 222, an axis 223 (e.g., 223a and 223b) that extends through connections (e.g., 223a' and 223b', respectively) of the top board 200, and a covering plate 224. Each of the first pivotal plates 220 of the pivotal members 22 is pivotally connected to the top board 200 and has a first engaging portion. Each of the second pivotal plates 222 of the pivotal members 22 is pivotally connected to the bottom board 202 and has a second engaging portion. Each of the covering plate 224 of the pivotal members 22 is connected between the corresponding first pivotal plate 220 and the corresponding second pivotal plate 222. The second fixing pins 224a of the pivotal members 22 are disposed on the covering plates 224. When the covering plates rotate together with the first pivotal plates 220 and the second pivotal plates 222 to cover the parts of the opening 206, the covering plates 224 abuts against the top board 200 and the bottom board 202 of the frame body 20, each of the first engaging portions of the first pivotal plate 220 is engaged with the corresponding first engaging structure 200a, and each of the second engaging portions of the second pivotal plate 222 is engaged with the corresponding second engaging structure 202a.

Furthermore, the top board 200 of the frame body 20 further includes two first plate bodies. Each of the first engaging portions of the first pivotal plates 220 is a first hole 220a. Each of the first engaging structures 200a of the top board 200 includes a first elastic piece 200a1 and a first protrusion 200a2. The first elastic pieces 200a1 of the first engaging structures 200a are connected to an edge of the first plate body. The first protrusions 200a2 of the first engaging structures 200a are disposed at surfaces of the first elastic pieces 200a1 facing away from the accommodating space S. During the period that the pivotal members 22 cover toward the opening 206 of the frame body 20, each of the first pivotal plates 220 push the corresponding first protrusion 200a2 of the corresponding first engaging structure 200a, so as to make the corresponding first elastic piece 200a1 move toward the accommodating space S. When the covering plates 224 abut against the top board 200 and the bottom board 202 of the frame body 20, each of the first elastic pieces 200a1 of the first engaging structures 200a recover to make the corresponding first protrusion 200a2 be engaged with the corresponding first hole 220a.

The bottom board 202 of the frame body 20 further includes two second plate bodies. Each of the second engaging portions of the second pivotal plates 222 is a second hole 222a. Each of the second engaging structures 202a of the bottom board 202 includes a second elastic piece 202a1 and a second protrusion 202a2. The second elastic pieces 202a1 of the second engaging structures 202a are connected to an edge of the second plate body. The second protrusions 202a2 of the second engaging structures 202a are disposed at surfaces of the second elastic pieces 202a1 facing away from the accommodating space S. During the period that the pivotal members 22 cover toward the opening 206 of the frame body 20, each of the second pivotal plates 222 push the corresponding second protrusion 202a2 of the corresponding second engaging structure 202a, so as to make the corresponding second elastic piece 202a1 move toward the accommodating space S. When the covering plates 224 abut against the top board 200 and the bottom board 202 of the frame body 20, each of the second elastic pieces 202a1 of the second engaging structures 202a recover to make the corresponding second protrusion 200a2 be engaged with the corresponding second hole 220a.

Hence, when the pivotal members 22 of the fixing bracket 2 cover the parts of the opening 206 of the frame body 20, the first engaging portions (i.e., the first holes 220a) and the second engaging portions (i.e., the second holes 222a) on the pivotal members 22 are respectively engaged with the first engaging structures 200a (i.e., the first protrusions 200a2) and the second engaging structures 202a (i.e., the second protrusions 202a2), so as to prevent the problem that the pivotal members 22 unexpectedly open the opening 206 to make first fixing pins 204a on the frame body 20 and the second fixing pins 224a on the pivotal members 22 be unable to fix to the fixing holes 300 on the storage devices 3, and thus to prevent the storage devices 3 from leaving the frame body 20.

However, in order to achieve the purpose of engaging the pivotal members 22 to the frame body 20 when the pivotal members 22 cover the parts of the opening 206, in an embodiment of the disclosure, only the first engaging structures 200a are disposed on the top board 200 of the frame body 20, and only the first engaging plates are disposed on the pivotal members 22 for engaged with the first engaging structures 200a. Alternatively, in another embodiment of the disclosure, only the second engaging structures 202a are disposed on the bottom board 202 of the frame body 20, and only the second engaging plates are disposed on the pivotal members 22 for engaged with the second engaging structures 202a.

Figure 4:
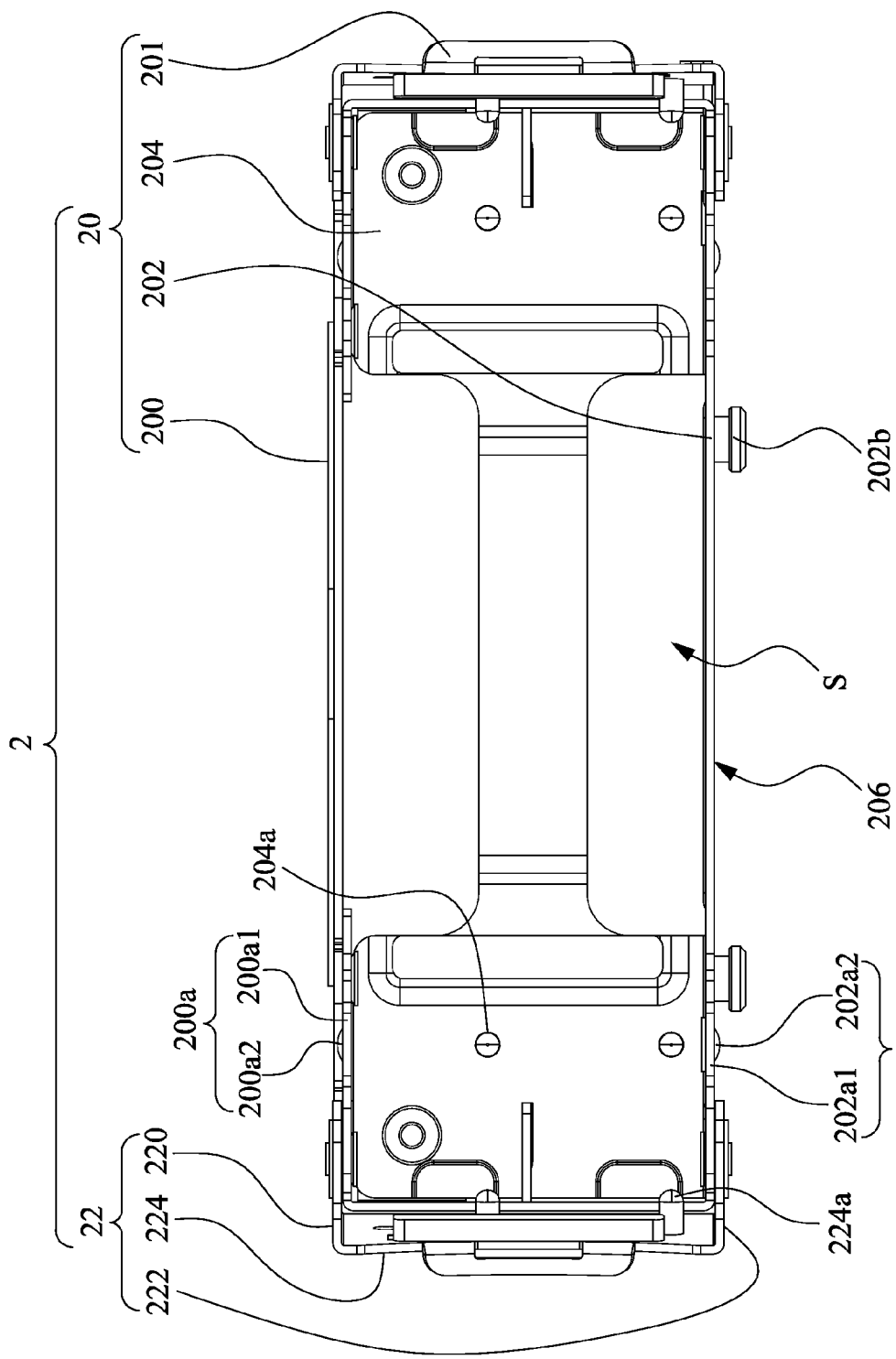
FIG. 4 is a front view of the fixing bracket in FIG. 1A.
Figure 5:
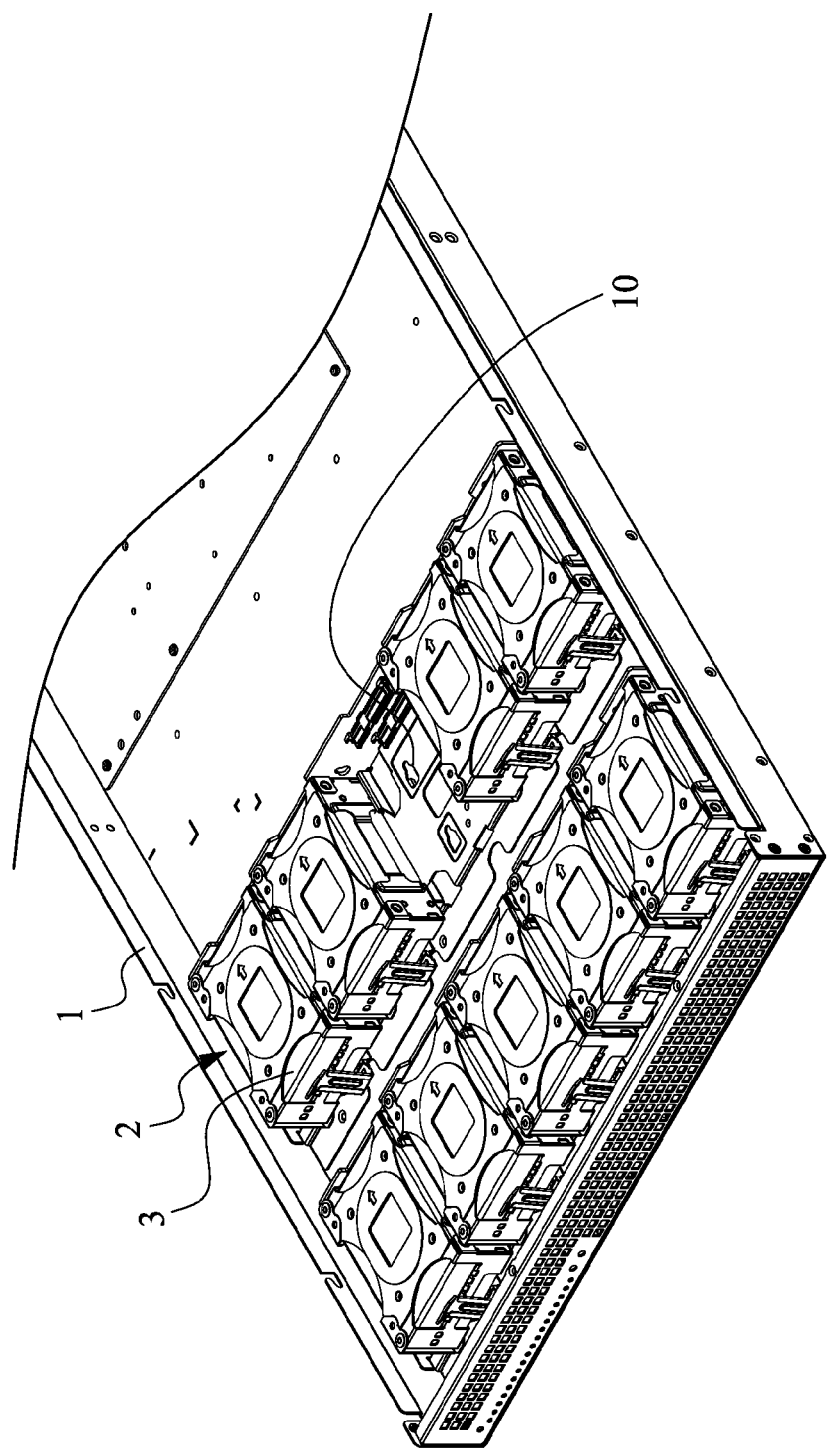
FIG. 5 is a perspective view showing the fixing bracket fixes the storage devices in a housing according to an embodiment of the disclosure.

FIG. 4 is a front view of the fixing bracket 2 in FIG. 1A. FIG. 5 is a perspective view showing the fixing bracket 2 fixes the storage devices 3 in a housing 1 according to an embodiment of the disclosure.

As shown in FIG. 4 and FIG. 5, the bottom board 202 of the frame body 20 further includes a plurality of third engaging structures 202b. The third engaging structures 202b of the bottom board 202 are located at a surface of the bottom board 202 facing away from the accommodating space S to be engaged with chutes 10 on the housing 1. Hence, the fixing bracket 2 of the disclosure can achieve the purpose of rapidly fixing the storage devices 3 in the housing 1 without using screws.

It should be pointed out that the number of the third engaging structures 202b included disposed on the bottom board 202 is not limited in this regard and can be adjusted as needed.

According to the foregoing recitations of the embodiments of the disclosure, it can be seen that the fixing bracket of the disclosure is capable of accommodating a plurality of storage devices. After the storage devices are accommodated in the fixing bracket and the pivotal members cover the parts of the opening of the frame body, the first fixing pins disposed on the frame body and the second fixing pins disposed on the pivotal members respectively insert into the fixing holes at two opposite sidewalls of the storage devices, so as to achieve the purpose of fixing the storage devices in the fixing bracket. Furthermore, when the pivotal members cover the parts of the opening, the engaging portions on the pivotal members are engaged with the engaging structures on the frame body, so as to prevent the problem that the pivotal members unexpectedly open the opening and thus let the storage devices to leave the frame body. Moreover, the fixing bracket of the disclosure further has an additional engaging structure disposed at the bottom of the frame body to be engaged with the chute of the housing, so as to achieve the purpose of rapidly fixing the storage devices in the housing without using screws.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A fixing bracket for fixing a plurality of storage devices in a housing, each of the storage devices having a first sidewall and a second sidewall that are opposite to each other and respectively have a plurality of fixing holes, the fixing bracket comprising:
  a frame body having an opening and an accommodating space, the frame body comprising a plurality of first fixing pins in the accommodating space, a top board and a bottom board, wherein the opening is configured to receive the plurality of storage devices into the accommodating space, and each of the first fixing pins for being inserted into the respective fixing hole on the first sidewall;
  a backboard opposite the opening;
  a plurality of connecting ribs, the accommodating space bounded by the backboard, the plurality of connecting ribs, and the opening; and
  two independent pivotal members pivotally connected to the frame body to rotate to open or cover portions of the opening, one of the pivotal members configured to pivot about a first axis extending through a first connection of the frame body and the one of the pivotal member and the other of the pivotal members configured to pivot about a second axis extending through a second connection of the frame body and the other of the pivotal members, wherein the first axis and second axis are spaced apart and substantially parallel, each of the pivotal members comprising a plurality of second fixing pins, wherein when the pivotal members cover parts of the opening, each of the second fixing pins is for being inserted into the corresponding fixing hole on the second sidewall,
  wherein the bottom board further comprises a second plate body and two second engaging structures, the second engaging portion is a second hole, and each of the second engaging structures comprises:
    a second elastic piece connected to an edge of the second plate body; and
    a second protrusion perpendicularly disposed at a surface of the second elastic piece, wherein when the corresponding pivotal member moves toward the opening, a second pivotal plate pivotally connected to the bottom board pushes the second protrusion, so as to make the second elastic piece move toward the accommodating space, and when a covering plate abuts against the top board and the bottom board, the second elastic piece recovers to make the second protrusion be engaged with the second hole.

2. The fixing bracket of claim 1, wherein the frame body further comprises:
  the backboard connected between the top board and the bottom board, wherein the first fixing pins are disposed on the backboard, and wherein each of the pivotal members is pivotally connected to the top board and the bottom board.

3. The fixing bracket of claim 2, wherein the two second engaging structures are respectively adjacent to the pivotal members, and each of the pivotal members comprises:
  the second pivotal plate pivotally connected to the bottom board and having a second engaging portion; and
  a covering plate connected to the second pivotal plate, wherein the second fixing pins are disposed on the covering plate, and when the covering plate rotates together with the second pivotal plate to cover the portions of the opening, the covering plate abuts against the top board and the bottom board, and the second engaging portion is engaged with the corresponding second engaging structure.

4. The fixing bracket of claim 2, wherein the bottom board further comprises a third engaging structure, the third engaging structure is located on a surface of the bottom board away from the accommodating space to be engaged with a chute of the housing.

5. The fixing bracket of claim 2, wherein the top board comprises two first engaging structures respectively adjacent to the pivotal members, and each of the pivotal members comprises:
  a first pivotal plate pivotally connected to the top board and having a first engaging portion; and
  the covering plate connected to the first pivotal plate, wherein the second fixing pins are disposed on the covering plate, and when the covering plate rotates together with the first pivotal plate to cover the portions of the opening, the covering plate abuts against the top board and the bottom board, and the first engaging portion is engaged with the corresponding first engaging structure.

6. The fixing bracket of claim 5, wherein the top board further comprises a first plate body, the first engaging portion is a first hole, and each of the first engaging structures comprises:
  a first elastic piece connected to an edge of the first plate body; and
  a first protrusion perpendicularly disposed at a surface of the first elastic piece, wherein when the respective pivotal member covers over the portions of opening, the corresponding first pivotal plate pushes the first protrusion, so as to make the first elastic piece move toward the accommodating space, and when the corresponding covering plate abuts against the top board and the bottom board, the first elastic piece recovers to make the first protrusion be engaged with the corresponding first hole.

7. A fixing bracket for fixing a plurality of storage devices in a housing, each of the storage devices having a first sidewall and a second sidewall that are opposite to each other and respectively have a plurality of fixing holes, the fixing bracket comprising:
  a frame body having an opening and an accommodating space, the frame body comprising a plurality of first fixing pins in the accommodating space, wherein the opening is configured to receive the plurality of storage devices into the accommodating space, and each of the first fixing pins for being inserted into the corresponding fixing hole on the first sidewall;
  a backboard opposite the opening;
  a plurality of connecting ribs, the accommodating space bounded by the backboard, the plurality of connecting ribs, and the opening; and
  two independent pivotal members pivotally connected to the frame body to rotate to open or cover portions of the opening, one of the pivotal members configured to pivot about a first axis extending through a first connection of the frame body and the pivotal member and the other of the pivotal members configured to pivot about a second axis extending through a second connection of the frame body and the other of the pivotal members, wherein the first axis and second axis are spaced apart and substantially parallel, each of the pivotal members comprising a plurality of second fixing pins, wherein when the pivotal members cover the portions of the opening, each of the second fixing pins is for being inserted into the corresponding fixing hole on the second sidewall;
  wherein the frame body comprises:

a top board;

a bottom board parallel to the top board, wherein each of the pivotal members is pivotally connected to the top board and the bottom board; and the backboard connected between the top board and the bottom board, wherein the first fixing pins are disposed on the backboard;

wherein the top board comprises two first engaging structures respectively adjacent to the pivotal members, and each of the pivotal members comprises:

a first pivotal plate pivotally connected to the top board and having a first engaging portion;

a covering plate connected to the first pivotal plate, wherein the second fixing pins are disposed on the covering plate, and when the covering plate rotates together with the first pivotal plate to cover portions of the opening, the covering plate abuts against the top board and the bottom board, and the first engaging portion is engaged with the corresponding first engaging structure;

wherein the top board further comprises a first plate body, the first engaging portion is a first hole, and each of the first engaging structures comprises:

a first elastic piece connected to an edge of the first plate body; and a first protrusion disposed at a surface of the first elastic piece facing away from the accommodating space, wherein when pivotal member moves toward the opening, the corresponding first pivotal plate pushes the first protrusion, so as to make the first elastic piece move toward the accommodating space, and when the corresponding covering plate abuts against the top board and the bottom board, the first elastic piece recovers to make the first protrusion be engaged with the corresponding first hole.

* * * * *